(12) United States Patent
Sasaki

(10) Patent No.: US 7,425,478 B2
(45) Date of Patent: Sep. 16, 2008

(54) SEMICONDUCTOR DEVICE AND METHOD OF FABRICATING THE SAME

(75) Inventor: Toshiyuki Sasaki, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 518 days.

(21) Appl. No.: 11/008,177

(22) Filed: Dec. 10, 2004

(65) Prior Publication Data

US 2006/0063321 A1 Mar. 23, 2006

(30) Foreign Application Priority Data

Sep. 17, 2004 (JP) ............................ P2004-272214

(51) Int. Cl.
*H01L 21/84* (2006.01)
(52) U.S. Cl. ..................... 438/157; 438/183
(58) Field of Classification Search ................. 438/157, 438/183
See application file for complete search history.

(56) References Cited

U.S. PATENT DOCUMENTS

| 4,923,823 | A | * | 5/1990 | Kohno ........................ 438/183 |
| 5,093,274 | A | * | 3/1992 | Kohno ........................ 438/593 |
| 6,054,355 | A | * | 4/2000 | Inumiya et al. ............. 438/296 |
| 6,515,320 | B1 | | 2/2003 | Azuma et al. |
| 6,524,901 | B1 | * | 2/2003 | Trivedi ....................... 438/183 |
| 6,927,110 | B2 | * | 8/2005 | Kanemoto ................... 438/183 |
| 6,977,228 | B2 | * | 12/2005 | Kohyama et al. ........... 438/706 |
| 7,078,284 | B2 | * | 7/2006 | Trivedi ....................... 438/197 |
| 2002/0011629 | A1 | * | 1/2002 | Chan et al. .................. 257/368 |
| 2004/0132237 | A1 | * | 7/2004 | Kanemoto ................... 438/183 |

FOREIGN PATENT DOCUMENTS

JP 2003-332567 11/2003

* cited by examiner

*Primary Examiner*—Mary Wilczewski
*Assistant Examiner*—Seth Barnes
(74) *Attorney, Agent, or Firm*—Finnegan, Henderson, Farabow, Garrett & Dunner, L.L.P.

(57) ABSTRACT

A semiconductor device and a method of fabricating the semiconductor device are described. There is provided the semiconductor device including, a semiconductor substrate, a gate insulating layer on the semiconductor substrate, a two-step gate electrode formed on the gate insulating layer, the two-step gate electrode having a first gate electrode layer formed on the gate insulating layer and a second gate electrode layer formed on the first gate electrode layer, the gate length of the second gate electrode layer being longer than that of the first gate electrode layer, extension regions formed in the semiconductor substrate to interpose a channel region of the semiconductor substrate beneath the second gate electrode layer, and source-drain regions formed in the outside of the extension regions toward the channel region, the source-drain regions adjoining the extension regions.

13 Claims, 16 Drawing Sheets

SEMICONDUCTOR DEVICE AND METHOD OF FABRICATING THE SAME

CROSS REFERENCE TO RELATED APPLICATION

This application is based upon and claims the benefit of priority from the prior Japanese Patent Application (No. 2004-272214, filed on Sep. 17, 2004), the entire contents of which are incorporated herein by reference.

FIELD OF THE INVENTION

The present invention relates to a semiconductor device and a method of fabricating the semiconductor device.

DESCRIPTION OF THE BACKGROUND

In recent years, a MIS LSI is desired to have more high performance and more high density integration. In order to realize these requirements, semiconductor technologies, such as miniaturizing a gate size of a MISFET and suppressing a lateral diffusion of impurities in a source-drain region, have been developed in accordance with a scaling rule.

Decreasing the gate size of the MISFET by the miniaturization generally involves a short channel effect on MISFET characteristics by spreading a depletion region near a drain region of a silicon substrate. The short channel effect is greatly influenced by extension regions formed in a source-drain structure of the MISFET.

Such the extension regions are formed in following steps. Conductive impurities are introduced into the silicon substrate by using ion implantation employing the gate electrode as a mask, after forming a gate electrode. Subsequent thermal annealing activates the implanted impurities. The impurities deeply and laterally diffuse into the silicon substrate. The impurity diffusion is also accompanied by thermal annealing in following steps of the MISFET process. Accordingly, the miniaturization of the gate length leads to the short channel effect.

In order to solve this problem, a notch-type gate electrode has been proposed. For example, Japanese Patent Publication (Kokai) No.2003-332567 discloses a method of fabricating a semiconductor device having a notch-type gate electrode. In the notch-type gate electrode, the gate electrode having a longer gate length than a predetermined gate length is formed first. The upper side wall of the gate electrode is covered with a mask, subsequent etching of the lower side wall of the gate electrode shorten the length of the gate electrode. The length of the gate electrode is defined at the shortened length of the lower gate electrode portion.

On the other hand, the ion implantation forming the extension region is performed employing the upper gate electrode as a mask, thus, the channel region of the MISFET is formed in the surface of the silicon substrate beneath the upper gate electrode rather than in lower gate electrode. As a result, a channel length suppressing the short channel effect can be formed in the surface region beneath the notch-type gate electrode. The miniaturization of the MISFET can be realized by the notch-type gate electrode.

However, there are some problems in the notch-type gate electrode structure. For example, it is difficult to control the gate electrode length with high precision. Because the lower side wall of the gate electrode is laterally etched, the gate electrode length is determined by the etching conditions, such as etching rate and etching time. That is, the difference between the length of the lower gate electrode and that of the upper gate electrode cannot be precisely controlled. Therefore, the MISFET with sufficient characteristics cannot be obtained in a case of the notched-type gate electrode.

Moreover, an etching rate of the gate electrode near an interface with a gate insulating layer becomes comparatively slow, and accordingly, forming the lower gate electrode with a straight shape is more difficult. Furthermore, as the processing steps of forming the side wall mask on the side wall of the upper gate electrode becomes comparatively long, a cost of fabricating the MISFET becomes comparatively high.

SUMMARY OF THE INVENTION

According to an aspect of the present invention, there is provided a semiconductor device including, a semiconductor substrate, a gate insulating layer on the semiconductor substrate, a two-step gate electrode formed on the gate insulating layer, the two-step gate electrode having a first gate electrode layer formed on the gate insulating layer and a second gate electrode layer formed on the first gate electrode layer, the gate length of the second gate electrode layer being longer than that of the first gate electrode layer, extension regions formed in the semiconductor substrate to interpose a channel region of the semiconductor substrate beneath the second gate electrode layer, and source-drain regions formed in the outside of the extension regions toward the channel region, the source-drain regions adjoining the extension regions.

Further, another aspect of the invention, there is provided a method of fabricating a semiconductor device including, forming a gate insulating layer on a semiconductor substrate, forming a first gate electrode layer on the gate insulating layer, forming a dummy gate electrode layer on the first gate electrode layer, selectively removing the dummy gate electrode layer and the first gate electrode layer to form proto-gate electrodes each having the dummy gate electrode layer stacked on the first gate electrode layer, forming an embedded layer between the proto-gate electrodes, removing the dummy gate electrode layer of the proto-gate electrodes to form a space region on the first gate electrode layer, extending the space region to a prescribed width by removing the portion of the embedded layer surrounding the space region, forming a second gate electrode layer in the extended space region to form two-step gate electrodes having the second gate electrode layer stacked on the first gate electrode layer, wherein the gate length of the second gate electrode layer is longer than the gate length of the first gate electrode layer, removing the embedded layer, forming extension regions in the semiconductor substrate by introducing impurities employing the two-step gate electrodes as a mask, forming a side-wall insulating layer on the side wall of the two-step gate electrodes, and forming source-drain regions in the semiconductor substrate by introducing impurities employing the two-step gate electrodes and the side-wall insulating layer as a mask.

DETAILED DESCRIPTION OF THE INVENTION

Figure 1A:
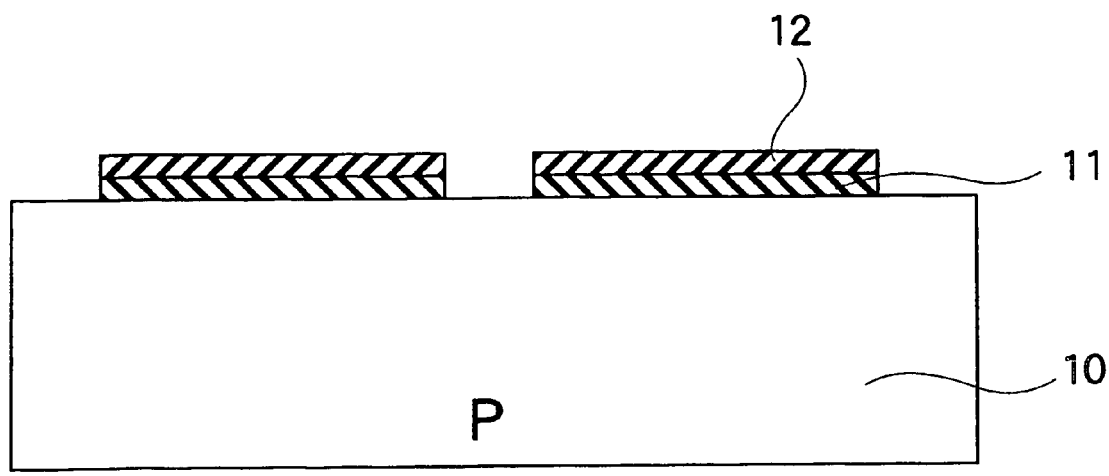
FIGS. 1A-1P are cross-sectional views showing a fabrication method of a semiconductor device according to a first embodiment of the present invention.
Figure 1P:
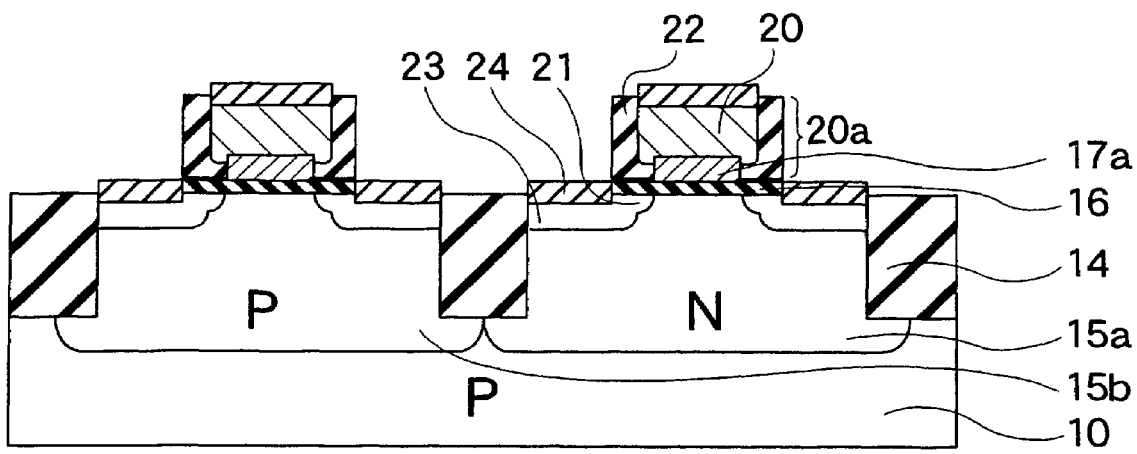
Figure 2A:
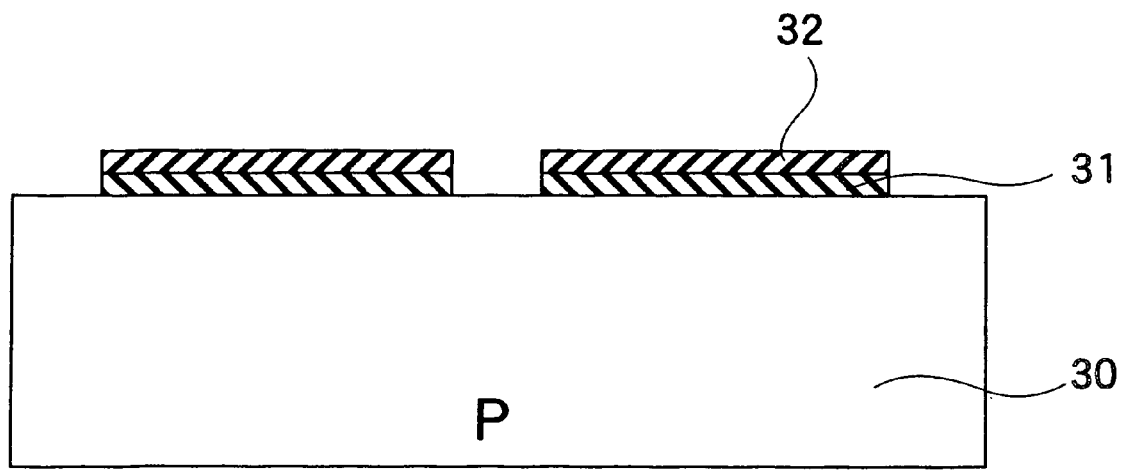
FIGS. 2A-2P are cross-sectional views showing a fabrication method of a semiconductor device according to a second embodiment of the present invention.

A first embodiment of the present invention is hereinafter described. FIGS. 1A-1P are cross-sectional views showing a fabrication method of a semiconductor device according to a first embodiment of the present invention. Moreover, FIG. 1P is a cross-sectional view of the semiconductor device in the first embodiment of the present invention. The semiconductor device in the first embodiment is a complementary MISFET (CMOS). Referring to FIGS. 2A-2P, a fabricating process of the semiconductor device is explained below.

Referring to FIGS. 1A-1D, steps of forming an isolation area are explained below. As shown in FIG. 1A, a p-type silicon substrate 10 is prepared as a semiconductor substrate. A first silicon oxide layer 11 is formed on the silicon substrate 10 using CVD. A first silicon nitride layer 12 is successively formed on the first silicon oxide layer 11 using CVD. The first silicon nitride layer 12 and the first silicon oxide layer 11 are selectively delineated using lithography and dry etching. As shown in FIG. 1A, a mask pattern with the first silicon nitride layer 12 stacked on the first silicon oxide layer 11 is formed on the silicon substrate 10.

Figure 1B:
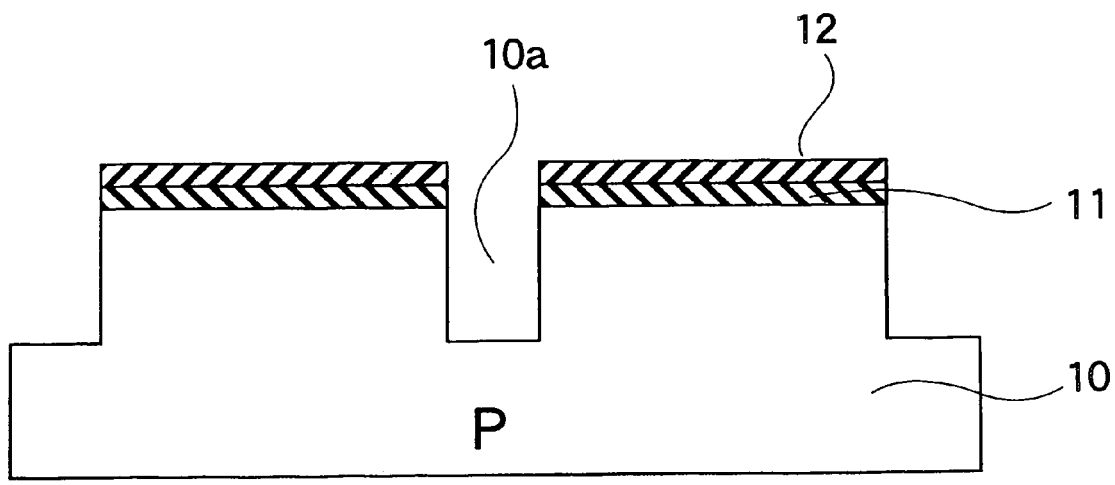

As shown in FIG. 1B, a shallow trench groove 10a is formed in the silicon substrate 10 by using dry etching, employing the mask pattern, i.e. the first silicon nitride layer 12 stacked on the first silicon oxide layer 11 as a mask.

Figure 1C:
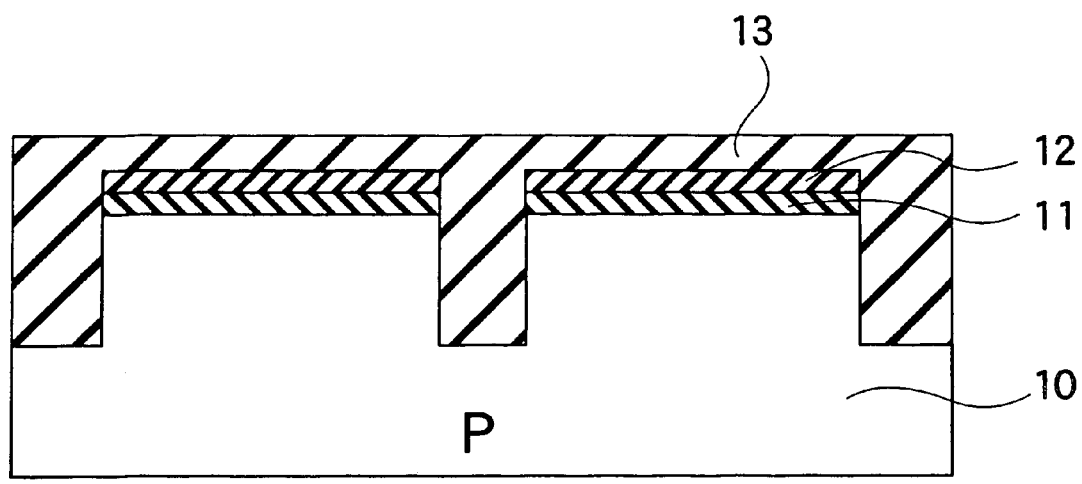

A second silicon oxide layer 13 is formed over the silicon substrate 10 including in the shallow trench groove 10a by using CVD, as shown in FIG. 1C.

The second silicon oxide layer 13 and the mask pattern, i.e. the first silicon nitride layer 12 stacked on the first silicon oxide layer 11 are removed by using CMP and etching to make the surface flat. The surface removing step is carried out down to the surface level of the silicon substrate 10, and the second silicon oxide layer 13 formed in the shallow trench groove 10a remains intact. The second silicon oxide layer 13 embedded in the shallow trench groove 10a is an isolation area 14, as shown in FIG. 1D.

Figure 1D:
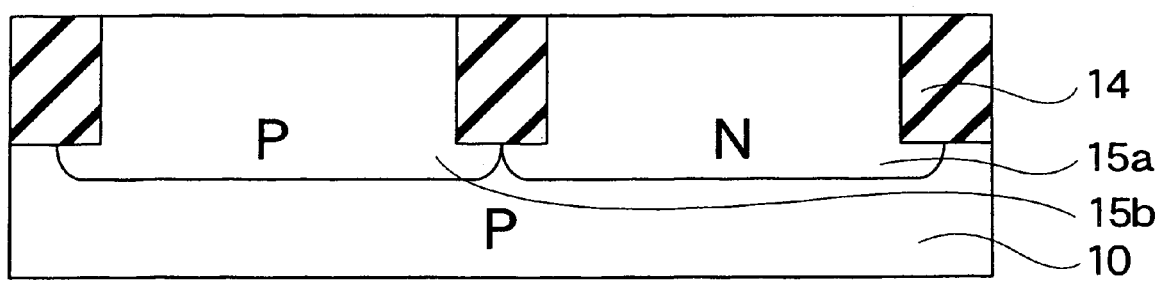

Furthermore, a p-type well 15b and a n-type well 15a in the CMOS region are selectively separated by introducing impurities, respectively, as shown in FIG. 1D. In this embodiment, boron ions as p-type impurities and phosphorus ions or arsenic ions as n-type impurities, respectively, are implanted with a dose of approximately $1 E 12 cm^{-2}$ to $1 E 14 cm^{-2}$ into the silicon substrate 10 by using lithography and ion implantation. Subsequent thermal annealing activates the implanted impurities. The p-type impurities may be not introduced into the p-type well 15b, as the silicon substrate 10 is the p-type silicon. A double well structure of a p-type well in an n-type well may also be used.

Steps of forming a first gate electrode structure are explained below. FIGS. 1E-1H show cross-sectional views of the semiconductor device in the processing steps. First, a channel region is formed using an ion implantation technique. A third silicon oxide layer (not illustrated) having a thickness of 10 nm is formed on the silicon substrate 10 for protecting the surface region of the silicon substrate 10. In order to control threshold voltages of the MISFET, impurities are implanted into the surface region of the silicon substrate 10 through the silicon oxide layer. Boron ions as p-type impurities and phosphorus ions or arsenic ions as n-type impurities, respectively, are implanted with a dose of approximately $1 E 12 cm^{-2}$ to $1 E 14 cm^{-2}$ into the silicon substrate 10 using lithography and ion implantation. Subsequent rapid thermal annealing at a temperature of 900° C. and for a time of such as 10 seconds activates the implanted impurities. On the other hand, the third silicon oxide layer is removed by using wet etching.

Figure 1E:
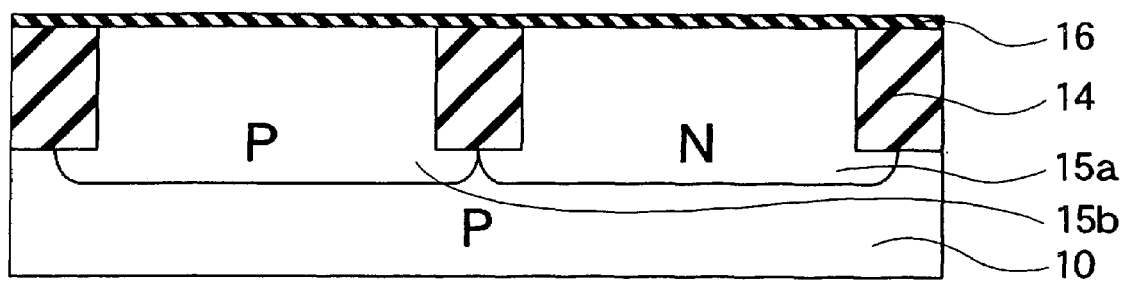

As shown in FIG. 1E, a hafnium oxide layer 16 having a thickness of 6 nm is chemically deposited on the silicon substrate 10 as a gate insulating layer. As relative dielectric constant of hafnium oxide is 22, for example, and is higher than that of silicon oxide and silicon nitride, hafnium oxide is used for a high dielectric material to obtain a high speed CMOS device.

Figure 1F:
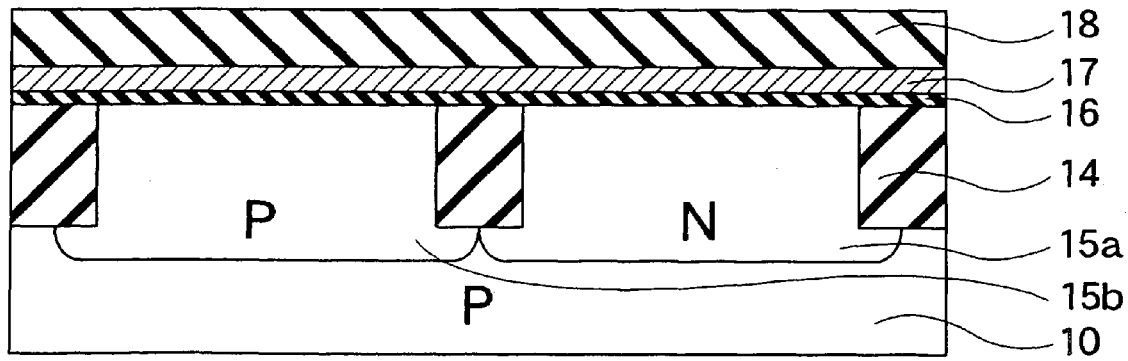

As shown in FIG. 1F, a polycrystalline silicon layer 17 having a thickness of 50 nm is deposited by using LPCVD. Subsequently, in order to control a threshold voltage of the MISFET, boron ions as p-type impurities and phosphorus ions or arsenic ions as n-type impurities, are implanted with a dose of approximately $1 E 12 cm^{-2}$ to $1 E 14 cm^{-2}$ into the polycrystalline silicon layer 17 of the p-type MISFET and the n-type MISFET, respectively.

Figure 1G:
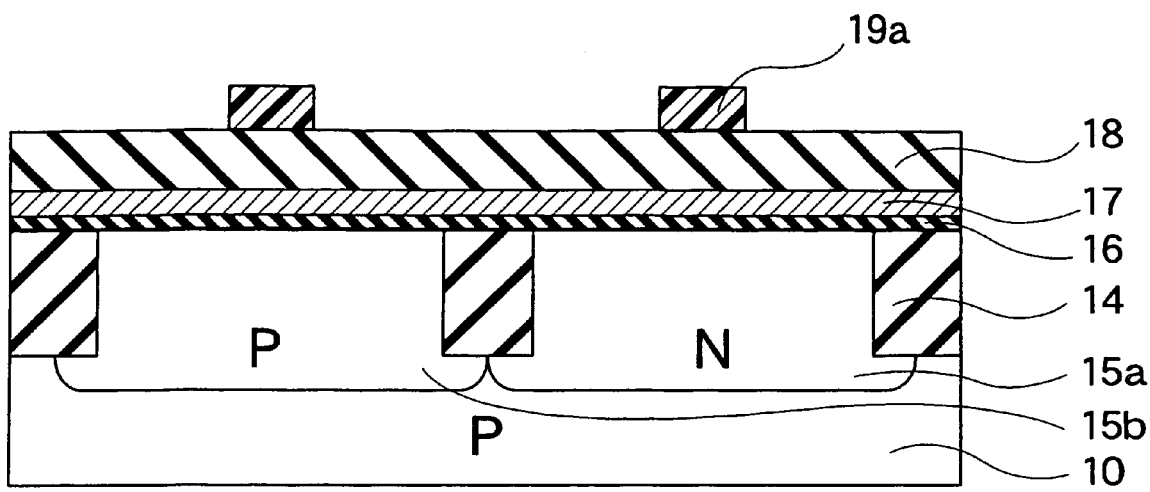

A second silicon nitride layer 18, having a thickness of 60 nm is deposited by using LPCVD. A resist layer is coated on the second silicon nitride layer 18. Successively, as shown in FIG. 1G, resist patterns 19a are formed at predetermined regions in the resist layer by using lithography.

Figure 1H:
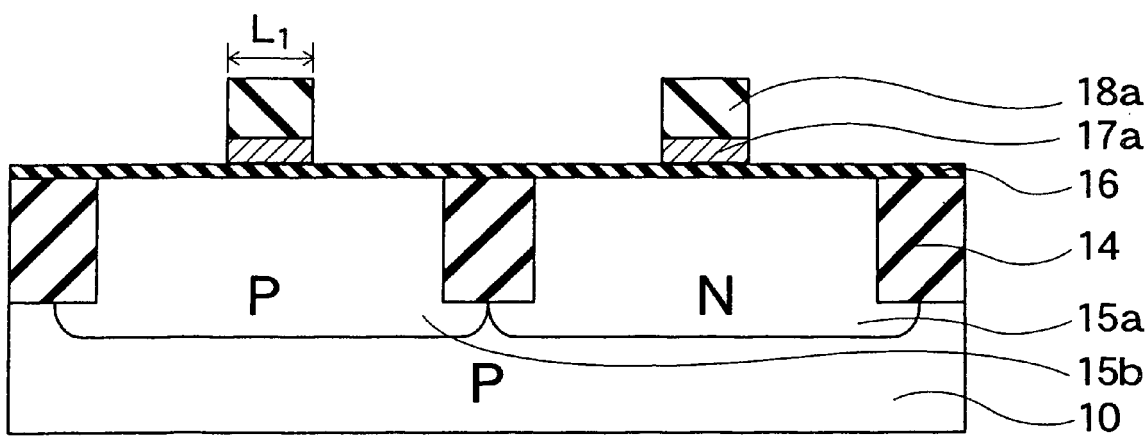

As shown in FIG. 1H, the second silicon nitride layer 18 is selectively delineated to form a dummy gate electrode layer 18a by using dry etching employing the resist patterns 19a as a mask, and subsequently, the resist patterns 19a are removed. Furthermore, the polycrystalline silicon layer 17 also is selectively delineated to form a first gate electrode layer 17a by using dry etching employing the dummy gate electrode layer 18a as a mask. As a result, a proto-gate electrode layer with the dummy gate electrode layer 18a stacked on the first gate electrode layer 17a is formed on the hafnium oxide layer 16. The first gate electrode layer 17a has a first gate length L1 of 100 nm.

Figure 1I:
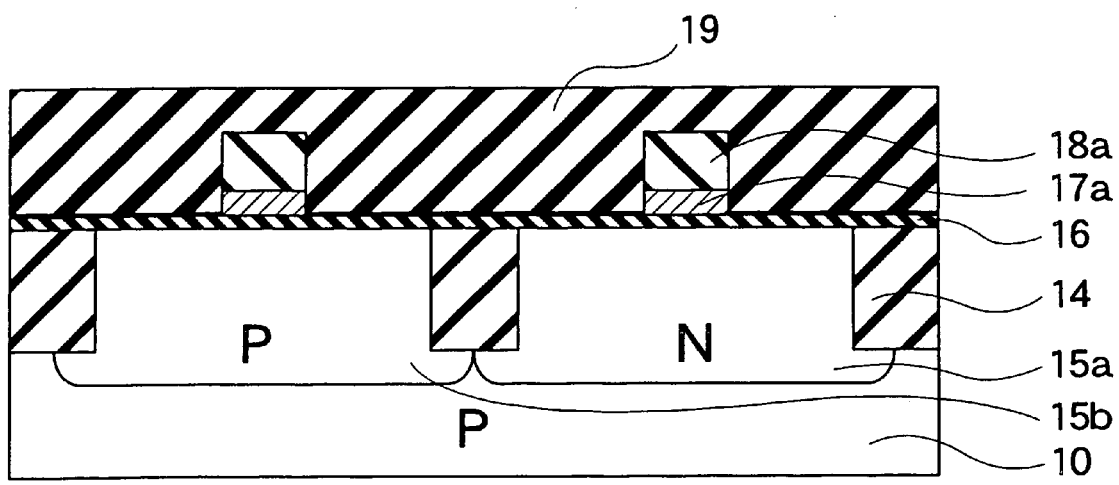

Steps of forming a second gate electrode structure are explained blow. FIGS. 1I-1M show cross-sectional views of the semiconductor device in the processing steps. First, as shown in FIG. 1I, a fourth silicon oxide layer as an embedded insulating layer 19 is formed over the silicon substrate 10 by using CVD so as to cover the proto-gate electrode layer with the dummy gate electrode layer 18a stacked on the first gate electrode layer 17a. As shown in FIG. 1I, the embedded insulating layer 19 is removed by using CMP and etching to make the surface flat.

Figure 1J:
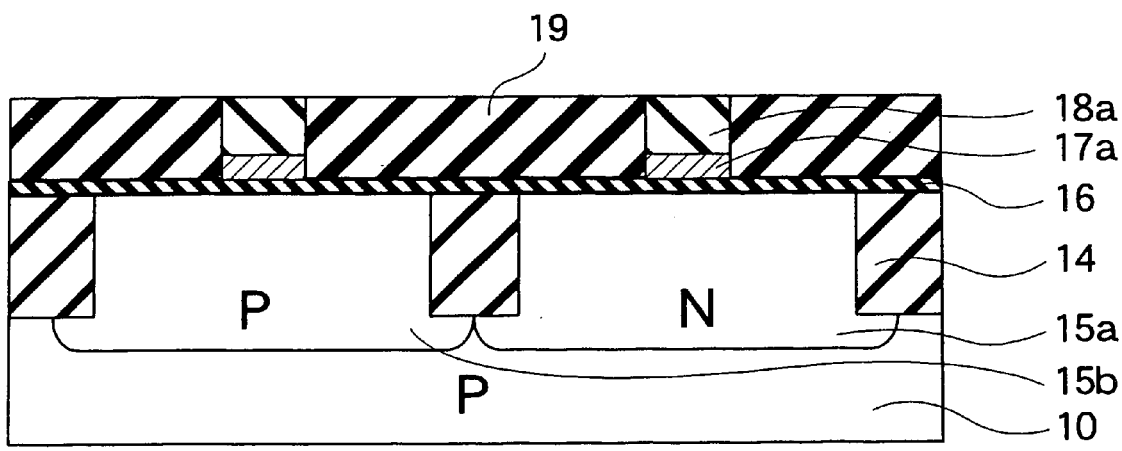

Flattening the surface of the embedded insulating layer 19 is carried out down to the surface level of the dummy gate electrode layer 18a, as shown in FIG. 1J. The embedded insulating layer 19 remains intact between the proto-gate electrodes, i.e. the dummy gate electrode layer 18a stacked on the first gate electrode layer 17a.

Figure 1K:
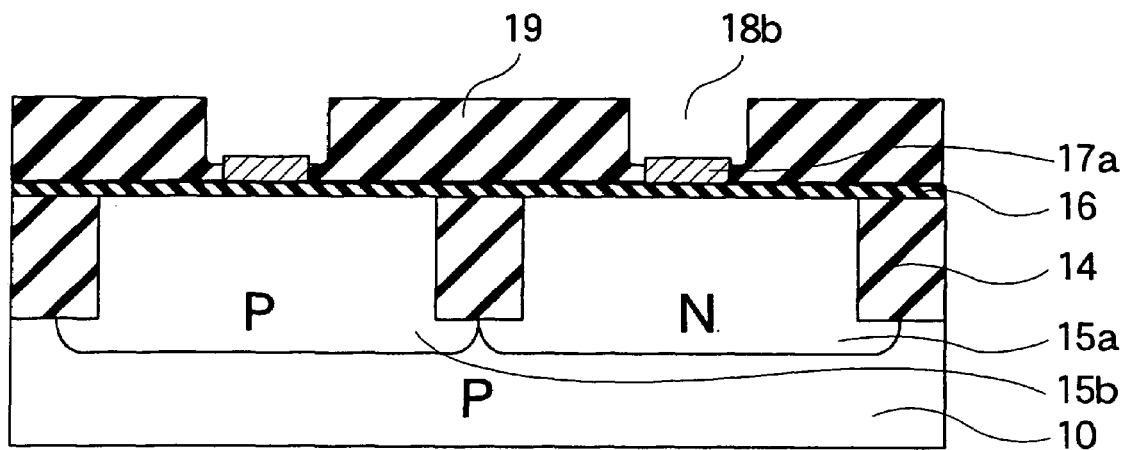

The dummy gate electrode layer 18a is selectively removed by using wet etching employing such as phosphoric acid as an etching solution. As a result, a space region 18b is formed above the first gate electrode layer 17a, as shown in FIG. 1K. Moreover, the side wall of the embedded insulating layer 19 surrounding the space region 18b is removed by using wet etching, and as a result, the space region 18b is extended 20 nm toward the gate length direction.

Figure 1L:
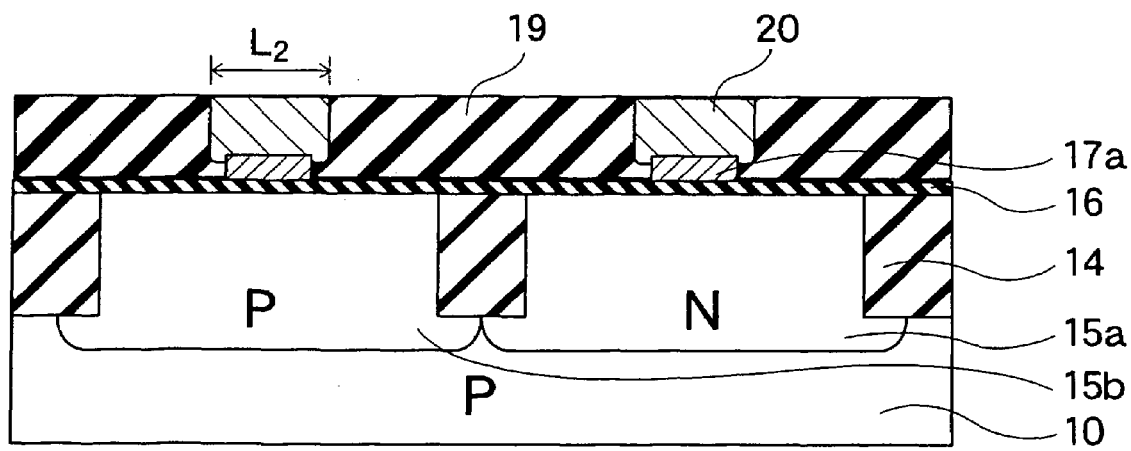

A tungsten-silicon compound layer with a thickness of 80 nm is formed over the silicon substrate 10 including the space region 18b by using LPCVD. In this step, the tungsten-silicon compound contains excess silicon for the stoichiometric composition ($WSi_2$). In a post thermal process to form a salicide structure, the excess silicon reacts with a cobalt layer to form cobalt-silicon compound on the tungsten-silicon compound layer. Next, the tungsten-silicon compound layer is removed by using CMP and etching to make the surface of the tungsten-silicon compound layer flat. Flattening the surface is carried out down to the surface level of the embedded insulating layer 19. As a result, as shown in FIG. 1L, a second gate electrode layer 20 having a second gate length L2 of 140 nm is embedded in the embedded insulating layer 19.

Figure 1M:
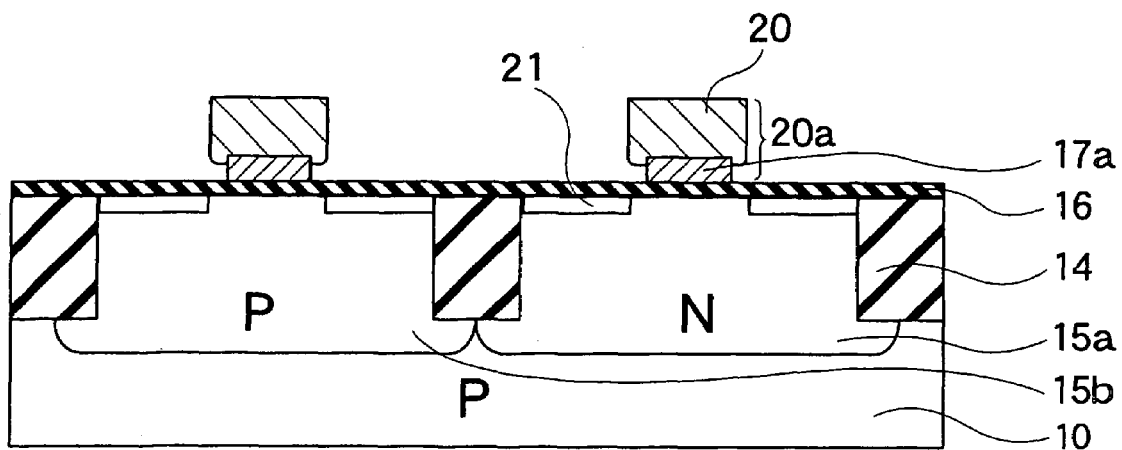

Next, the embedded insulating layer 19 is selectively removed. Two-step gate electrodes 20a with the second gate electrode layer 20 stacked on the first gate electrode layer 17a are formed on the hafnium oxide layer 16, as shown in FIG. 1M. The first gate length L1 and the second gate length L2 is 100 nm long and 140 nm long, respectively.

The difference between the second gate length L2 and first gate length L1 is determined to optimize the MISFET characteristics. For example, the difference is made shorter to avoid an off-set gate structure. On the other hand, the difference is made longer not to generate a short channel effect. For example, tungsten may be utilized as the second gate layer. In this case, forming TiN, as a barrier metal, under tungsten prevents the reaction between the first gate electrode layer and the second gate electrode layer at an annealing process. The metal layer may further provide higher speed of the gate interconnection.

Steps of forming a source-drain structure are explained blow. FIGS. 1M-1P show cross-sectional views of the semiconductor device in the processing steps. First, extension regions 21 are formed as shown in FIG. 1M. Boron ions as p-type impurities and phosphorus ions or arsenic ions as n-type impurities are implanted into the n-well region, and the p-well region, respectively, with a dose of approximately $1 \text{ E } 13 \text{ cm}^{-2}$ to $1 \text{ E } 15 \text{ cm}^{-2}$ by using lithography and ion implantation, employing the second gate electrode layer 20 as a mask. The extension regions 21 with a comparatively shallow junction depth are formed.

In order to control the diffusion of the implanted impurities, subsequent rapid thermal annealing at a temperature of 900° C. and for a time of 10 seconds activates the implanted impurities. Moreover, spike thermal annealing for a time below 1 millisecond may be employed to fully prevent the implanted impurities from diffusing laterally and deeply in the silicon substrate 10.

In this embodiment, the second gate electrode layer 20 is employed as the mask, thus, the extension regions 21 are formed in the portion 20 nm away from the channel region of the silicon substrate 10 beneath the first gate electrode layer 17a. As a result, this gate structure can suppress a short channel effect on the MISFET.

Figure 1N:
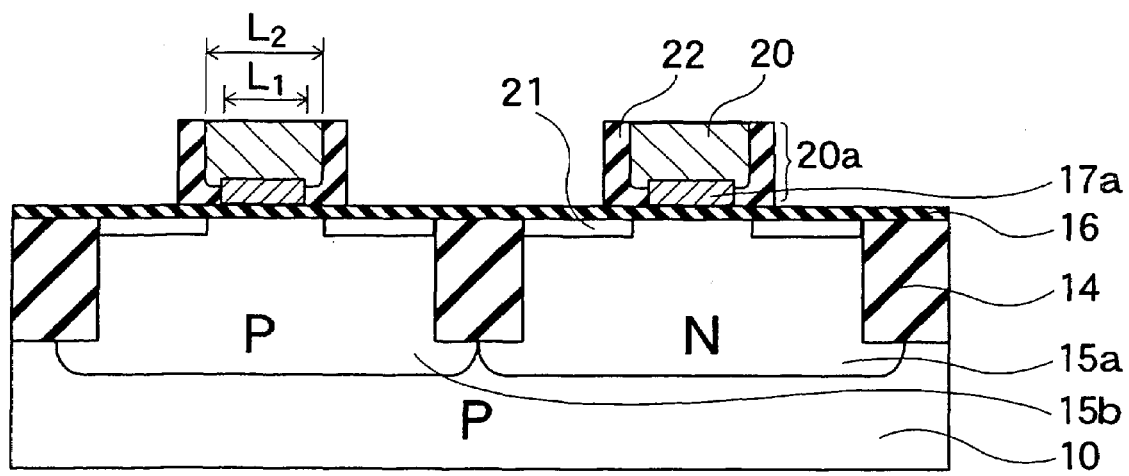

Next, source-drain regions are formed at the surface region of the silicon substrate 10. An insulating layer such as a third silicon nitride layer having a thickness of 20 nm is formed over the silicon substrate 10 by using LPCVD. The third silicon nitride layer on the second gate electrode layer 20 and the gate insulating layer 16 is removed by using anisotropic etching. As a result, a sidewall insulating layer 22 is selectively formed on a side surface of the two-step gate electrodes 20a, as shown in FIG. 1N.

Figure 1O:
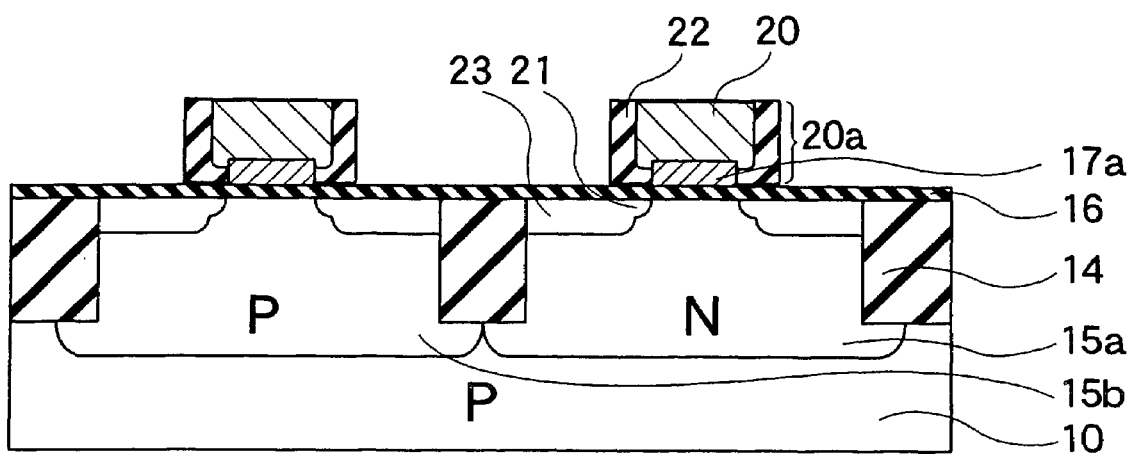

Boron ions as p-type impurities and phosphorus ions or arsenic ions as n-type impurities are implanted into the n-well region, and the p-well region, respectively, with a dose of approximately $1 \text{ E } 15 \text{ cm}^{-2}$ to $1 \text{ E } 16 \text{ cm}^{-2}$ by using lithography and ion implantation, employing the second gate electrode layer 20 and sidewall insulating layer 22 as a mask. The source-drain regions 23 with a comparatively deep junction depth are formed as shown in FIG.1O.

Subsequent rapid thermal annealing at a temperature of 900° C. and for a time of 10 seconds activates the implanted impurities. Moreover, spike thermal annealing for a time below 1 millisecond may be employed to fully prevent the implanted impurities from diffusing laterally and deeply in the silicon substrate 10.

The gate insulating layer, i.e. hafnium oxide layer 16 formed on the silicon substrate 10, is removed by using dry etching employing the two step gate electrode 20a and sidewall insulating layer 22 as a mask. A cobalt layer is formed over the silicon substrate 10. By subsequent thermal annealing at a temperature of 750° C. and for a time of 30 seconds, a cobalt-silicon compound layer 24, as a salicide structure, is formed on the source-drain regions 23 as shown in FIG. 1P.

As the cobalt layer on the second electrode layer 20 reacts with an excess silicon in the second electrode layer 20, cobalt-silicon compound layer 24 is also formed on the second electrode layer 20. Subsequently, the residual cobalt layer is selectively removed by wet etching.

A silicon oxide layer (not illustrated) is formed over the silicon substrate 10 by using plasma-assisted CVD. Contact holes are opened in the silicon oxide layer. A metal interconnection is formed. Furthermore, the formation of the silicon oxide layer, the contact holes, and the metal interconnection are carried out, as required. A multilevel interconnection can be formed. The surface of the silicon substrate 10 is covered with a protective insulating layer. Pad portions may be opened to complete the semiconductor device according to the first embodiment.

According to the first embodiment, the extension regions are formed by using the second gate electrode layer as a mask to separate the prescribed length from the channel region. As a result, a short channel effect on the MISFET can be suppressed.

Moreover, a silicon layer as the first gate electrode layer leads to the work function control and a silicon-metal compound as the second gate electrode layer leads to the low resistance of the gate interconnection.

Furthermore, the first gate length L1 of the first gate electrode layer is defined by lithography and the first gate electrode layer has comparatively thinner film thickness of 40 nm, thus the uniformity degree of the gate electrode patterns is high.

In addition, the first gate length L1 is miniaturized down to such as 100 nm; therefore, the two-step gate electrode may bring a greater improvement to a miniaturized MISFET than a conventional MISFET on the device performances. The first gate electrode layer may be partially overlapped on the extension regions from the view point of controlling the MISFET characteristics.

A second embodiment of the present invention is hereinafter described. FIGS. 2A-2P are cross-sectional views showing a fabrication method of a semiconductor device according to the second embodiment of the present invention. Moreover, FIG. 2P is a cross-sectional view of the semiconductor device in the second embodiment of the present invention. The semiconductor device in the second embodiment is a complementary MISFET (CMOS). Referencing to FIGS. 2A-2P, a fabricating process of the semiconductor device is explained below.

Referring to FIGS. 2A-2D, steps of forming an isolation area are explained below. As shown in FIG. 2A, a p-type silicon substrate 30 is prepared as a semiconductor substrate. A first silicon oxide layer 31 is formed on the silicon substrate 30 using CVD. A first silicon nitride layer 32 is successively formed on the first silicon oxide layer 31 using CVD. The first silicon nitride film 32 and the silicon first oxide layer 31 are selectively delineated by using lithography and dry etching.

As shown in FIG. 2A, a mask pattern with the first silicon nitride layer 32 stacked on the first silicon oxide layer 31 is formed on the silicon substrate 30.

Figure 2B:
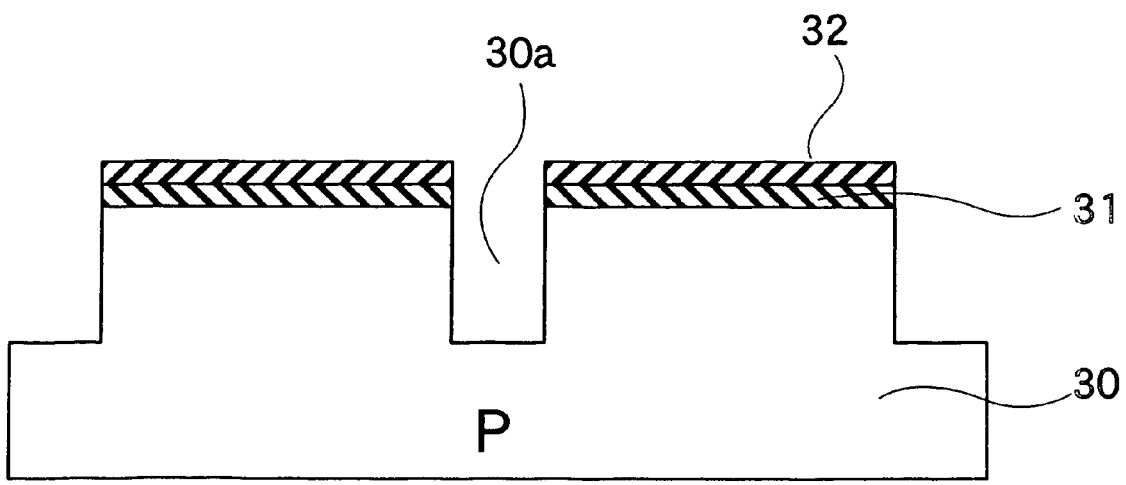

As shown in FIG. 2B, a shallow trench groove 30a is formed in the silicon substrate 10 by using dry etching, employing the mask pattern, i.e. the first silicon nitride layer 32 stacked on the first silicon oxide layer 31 as a mask.

Figure 2C:
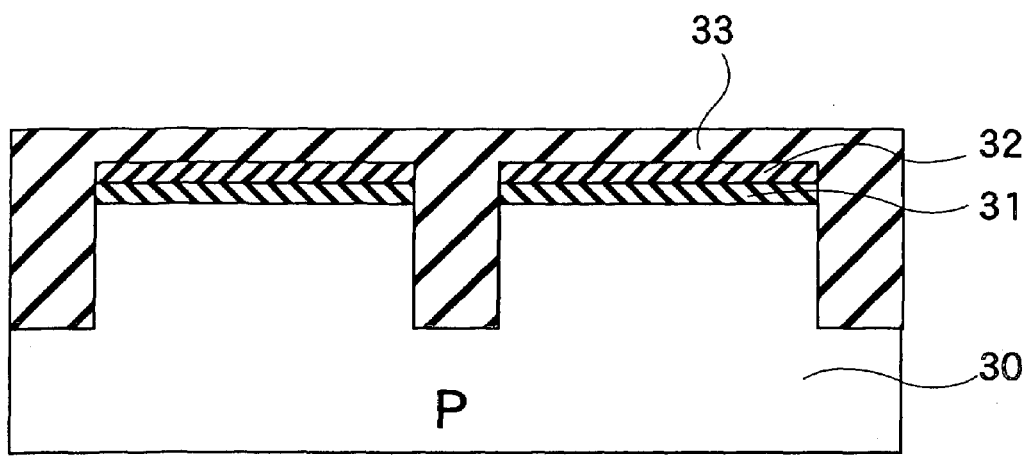

A second silicon oxide layer 33 is formed over the silicon substrate 30 including the shallow trench groove 30a by using CVD, as shown in FIG. 2C.

The second silicon oxide layer 33 and the mask pattern, i.e. the first silicon nitride layer 32 stacked on the first silicon oxide layer 31 are removed by using CMP and etching to make the surface flat. The surface flatness is carried out down to the surface level of the silicon substrate 30, and the second silicon oxide layer 33 formed in the shallow trench groove 30a remains intact. The second silicon oxide layer 33 embedded in the shallow trench groove 30a is an isolation area 34, as shown in FIG. 2D.

Figure 2D:
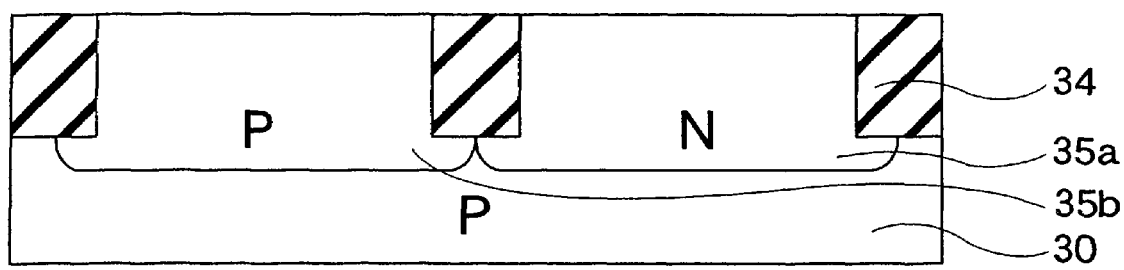

Furthermore, a p-type well 35b and a n-type well 35a in the CMOS region are selectively separated by introducing impurities, respectively, as shown in FIG. 2D. Boron ions as p-type impurities and phosphorus ions or arsenic ions as n-type impurities, respectively, are implanted with a dose of approximately $1 E 12 cm^{-2}$ to $1 E 14 cm^{-2}$ into the silicon substrate 30 by using lithography and ion implantation. Subsequent thermal annealing activates the implanted impurities.

Steps of forming a first gate electrode structure are explained below. FIGS. 2E-2H are cross-sectional views of the semiconductor device in the processing steps. First, a channel region is formed using ion implantation technique. A third silicon oxide layer (not illustrated) having a thickness of 10 nm is formed on the silicon substrate 30 for protecting the surface region of the silicon substrate 30. In order to control threshold voltages of the MISFET, impurities are implanted into the surface region of the silicon substrate 30 through the third silicon oxide layer. Boron ions are p-type impurities and phosphorus ions or arsenic ions as n-type impurities, respectively, are implanted with a dose of approximately $1 E 12 cm^{-2}$ to $1 E 14 cm^{-2}$ into the silicon substrate 30 by using lithography and ion implantation. Subsequent rapid thermal annealing at a temperature of 900° C. and for a time of 10 seconds activates the implanted impurities. On the other hand, the third silicon oxide layer is removed by using wet etching.

Figure 2E:
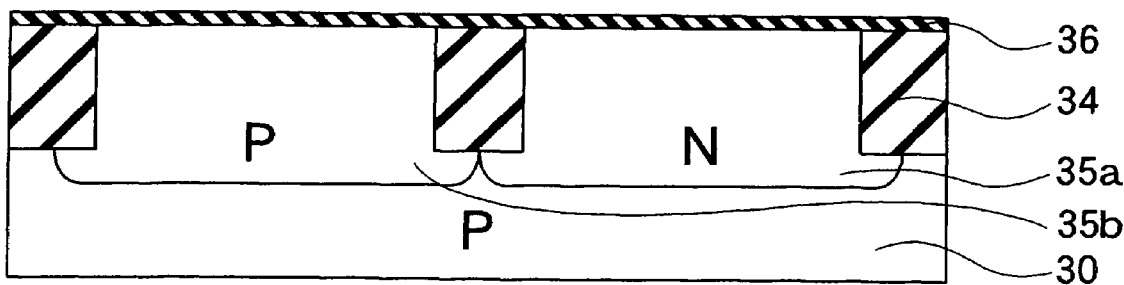

As shown in FIG. 2E, a silicon oxide layer having a thickness of 2 nm is thermally oxidized on the silicon substrate 10 as a gate insulating layer 36.

Figure 2F:
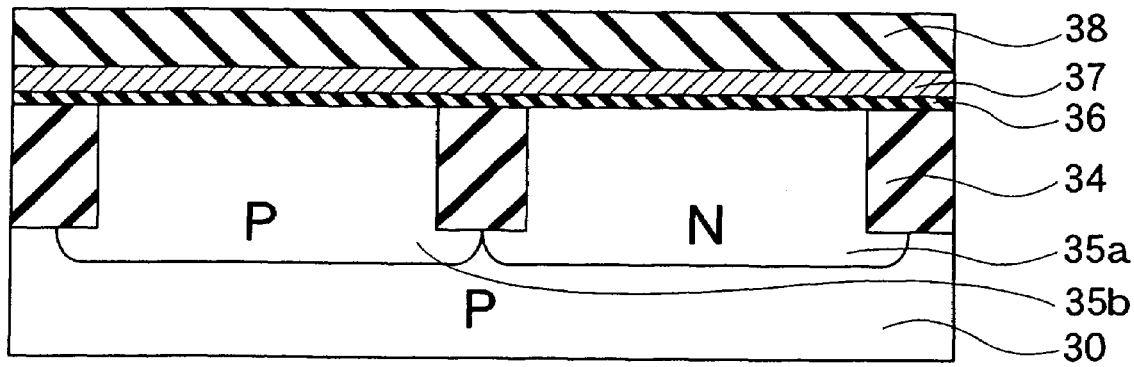

As shown in FIG. 2F, a polycrystalline silicon-germanium compound layer 37 having a thickness of 40 nm is deposited by using LPCVD. Subsequently, impurities may be implanted into the polycrystalline silicon-germanium compound layer 37. In order to control a threshold voltage of the MISFET, boron ions as p-type impurities and phosphorus ions or arsenic ions as n-type impurities, are implanted with a dose of approximately $1 E 12 cm^{-2}$ to $1 E 14 cm^{-2}$ into the polycrystalline silicon-germanium compound layer 37 of the p-type MISFET and the n-type MISFET, respectively.

Figure 2G:
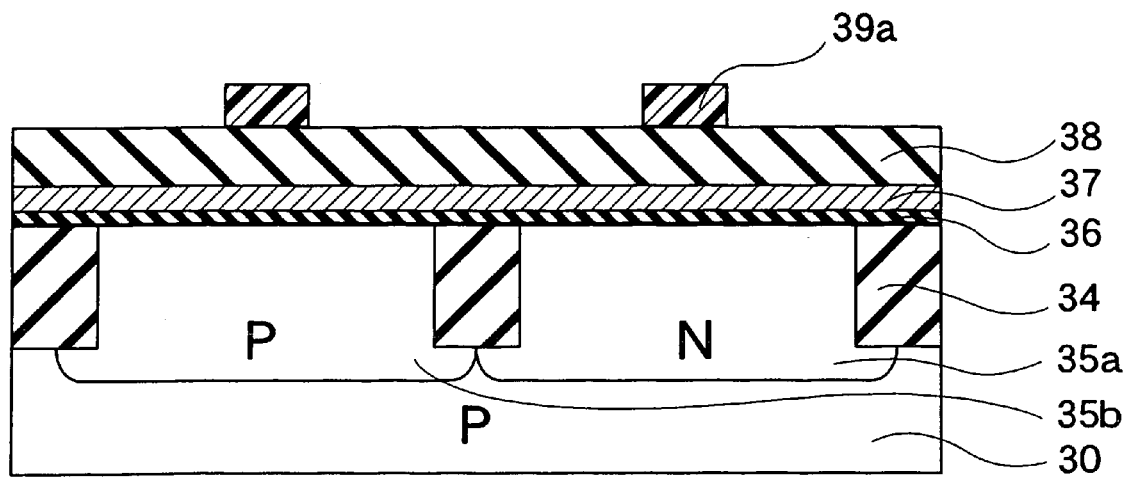

A second silicon nitride layer 38 having a thickness of 60 nm is deposited by using LPCVD. A resist layer is coated on the second silicon nitride layer 38. Successively, as shown in FIG. 2G, a resist pattern 39a is formed at a prescribed region in the resist layer by using lithography.

Figure 2H:
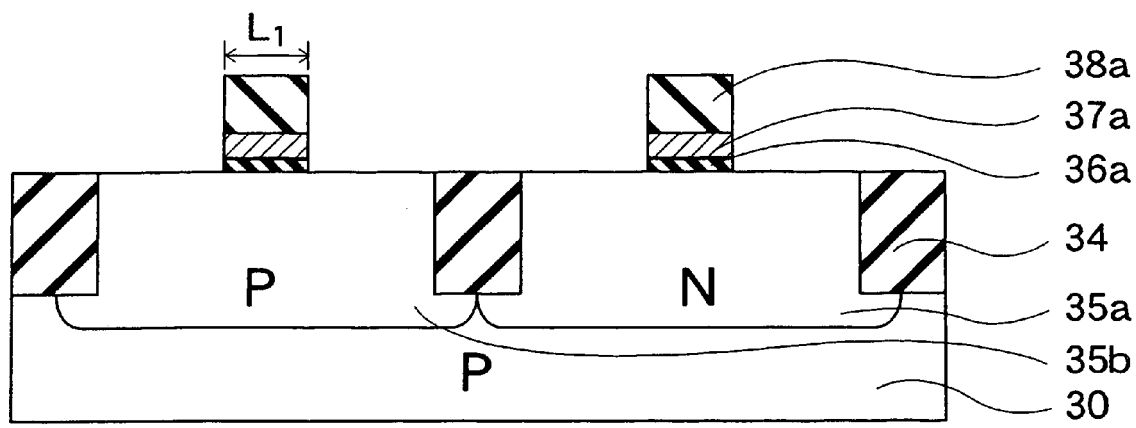

As shown in FIG. 2H, the second silicon nitride layer 38 is selectively delineated to form a dummy gate electrode layer 38a by using dry etching employing a resist pattern 39a as a mask, subsequently, the resist pattern 39a is removed. Furthermore, the polycrystalline silicon-germanium compound layer 37 also is selectively delineated to form a first gate electrode layer 37a by using dry etching employing the dummy gate electrode layer 38a as a mask. As a result, a proto-gate electrode layer with the dummy gate electrode layer 38a stacked on the first gate electrode layer 37a is formed on the gate insulating layer 36. The first gate electrode layer 37a has a first gate length L1 of 80 nm.

The gate insulating layer 36, i.e. thermal oxide layer, formed on the silicon substrate 30, is removed by using dry etching or wet etching employing the two step gate electrode 40a as a mask.

Figure 2I:
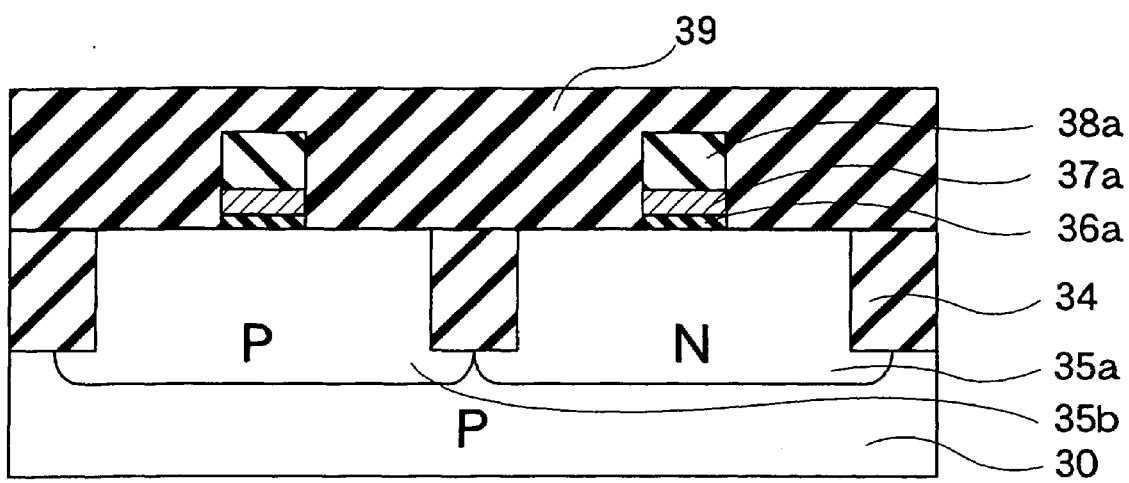

Steps of forming a second gate electrode structure are explained below. FIGS. 2I-2M show cross-sectional views of the semiconductor device in the processing steps. First, as shown in FIG. 2I, an embedded insulating layer 39 is formed over the silicon substrate 30 by using CVD so as to cover a proto-gate electrode layer with the dummy gate electrode layer 38a stacked on the first gate electrode layer 37a. As shown in FIG. 2I, the embedded insulating layer 39 is removed using CMP and etching to make the surface flat.

Figure 2J:
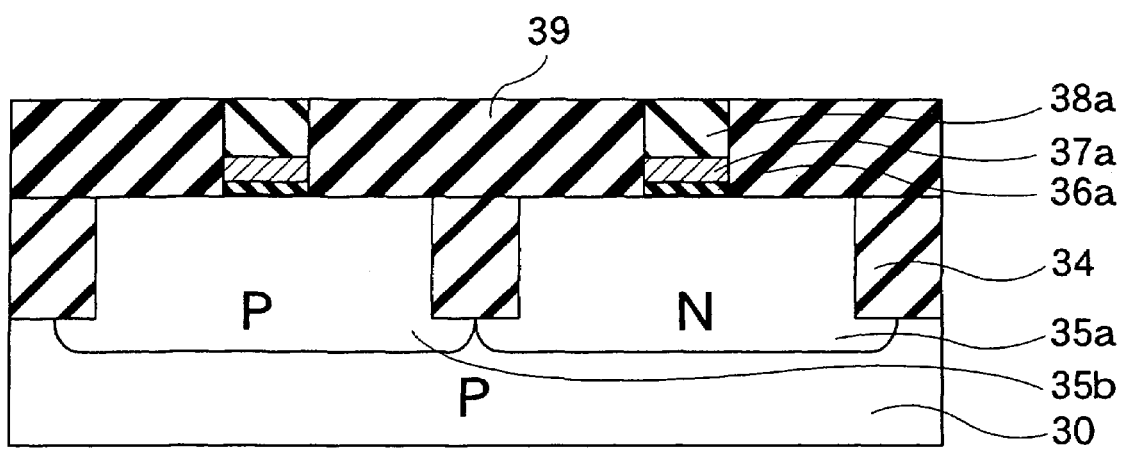

Flattening the surface of the embedded insulating layer 39 is carried out down to the surface level of the dummy gate electrode layer 38a, as shown in FIG. 2J. The embedded insulating layer 39 remains intact between the proto-gate electrodes, i.e. the dummy gate electrode layer 38a stacked on the first gate electrode layer 37a.

Figure 2K:
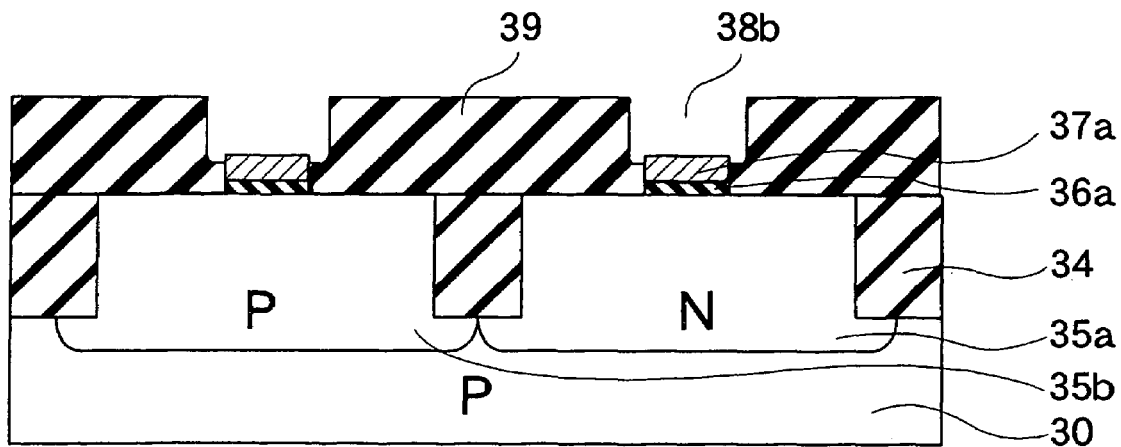

The dummy gate electrode layer 38a is selectively removed by using wet etching employing such as phosphoric acid as an etching solution. As a result, a space region 38b is formed above the first gate electrode layer 37a, as shown in FIG. 2K. Moreover, the side wall of the embedded insulating layer 39 surrounding the space region 38b is removed by using wet etching to extend 20 nm to the gate length direction.

Figure 2L:
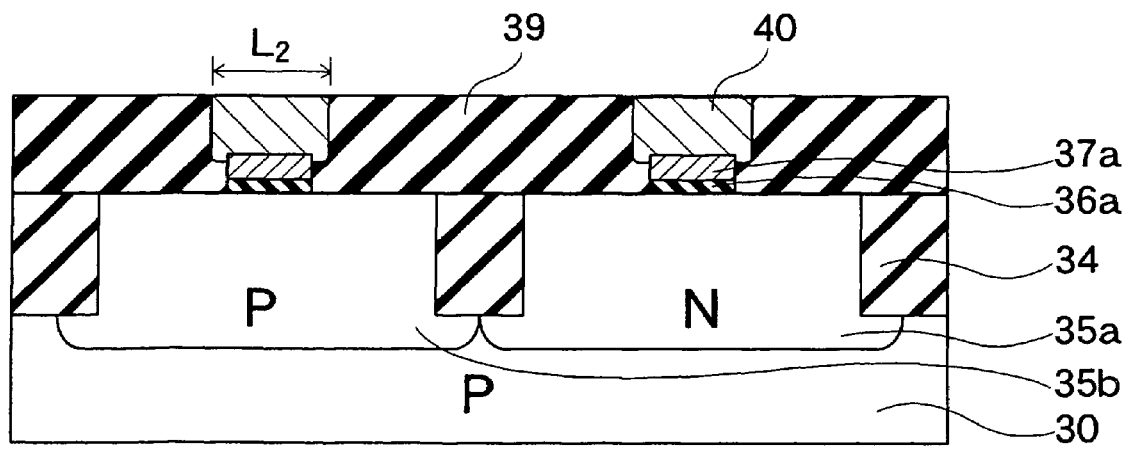

A titanium-silicon compound layer with a thickness of 80 nm is formed over the silicon substrate 30 by using LPCVD. In this step, the titanium-silicon compound layer contains excess silicon for the stoichiometric composition. In the post thermal process to form a salicide structure, the excess silicon reacts with a nickel layer to form nickel-silicon compound on the titanium-silicon compound layer. Next, the titanium-silicon compound layer is removed by using CMP and etching to make the surface of the titanium-silicon compound layer flat. Flattening the surface is carried out down to the surface level of the embedded layer 39. As shown in FIG. 2L, a second gate electrode layer 40 having a second gate length L2 of 120 nm is embedded in the embedded insulating layer 39.

Figure 2M:
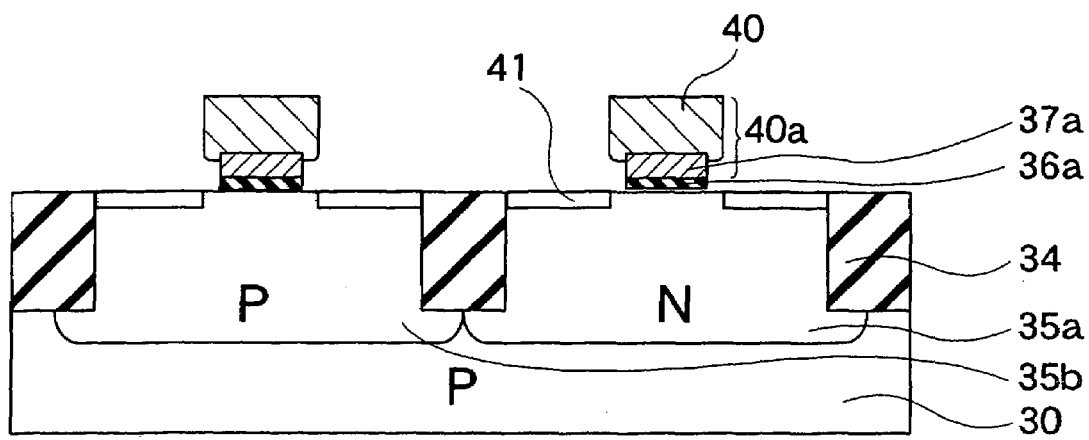

Furthermore, the embedded insulating layer 39 is selectively removed. Accordingly, two-step gate electrodes 40a with the first gate electrode layer 37a stacked on the second gate electrode layer 40 are formed on the gate insulating layer 36, as shown in FIG. 2M. The first gate length L1 and the first gate length L2 is 80 nm long and 120 nm long, respectively.

The difference between the second gate length L2 and first gate length L1 is determined to optimize the MISFET characteristics. For example, the difference is made shorter to avoid an off-set gate structure. On the other hand, the difference is made longer not to generate a short channel effect. For example, tungsten may be utilized as the second gate layer. In this case, forming TiN, as a barrier metal, under tungsten prevents the reaction between the first gate electrode layer and the second gate electrode layer at an annealing process. The metal layer may further provide higher speed of the gate interconnection.

Steps of forming a source-drain structure are explained blow. FIGS. 2M-2P show cross-sectional views of the semiconductor device in the processing steps. First, an extension regions 41 are formed as shown in FIG. 2M. Boron ions as p-type impurities and phosphorus ions or arsenic ions as n-type impurities are implanted into the n-well region, and the p-well region, respectively, with a dose of approximately 1 E 13 cm$^{-2}$ to 1 E 15 cm$^{-2}$ by using lithography and ion implantation, employing the second gate electrode layer 40 as a mask. The extension regions 41 with a comparatively shallow junction depth are formed.

In order to control the diffusion of the implanted impurities, subsequent rapid thermal annealing at a temperature of 900° C. and for a time of 10 seconds activates the implanted impurities. Moreover, spike thermal annealing for a time below 1 millisecond may be employed to fully prevent the implanted impurities from diffusing laterally and deeply in the silicon substrate 30.

In this embodiment, the second gate electrode layer 40 is employed as the mask, thus, the extension regions are formed in the portion 20 nm away from the channel region of the silicon substrate 30 beneath the first gate electrode layer 17a. As a result, this gate structure can suppress a short channel effect on the MISFET.

Figure 2N:
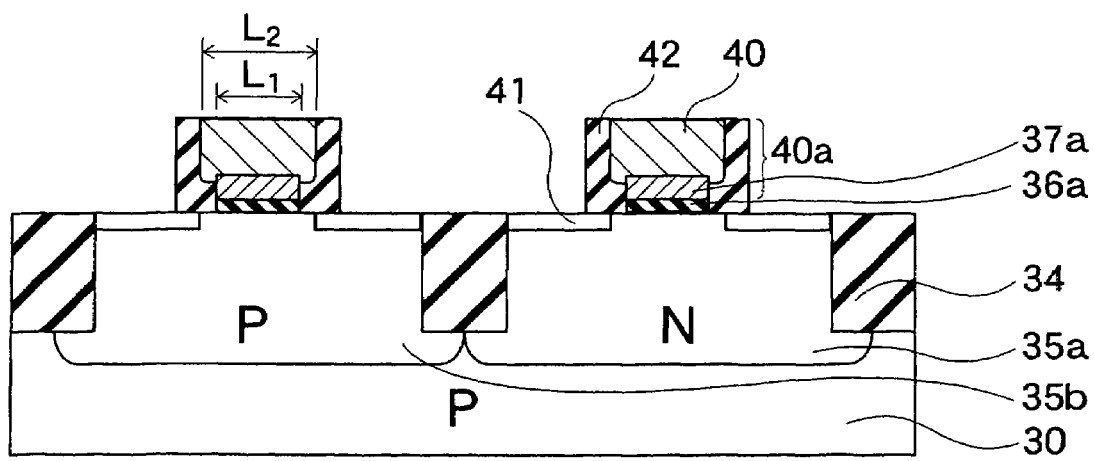

Next, source-drain regions are formed at the surface region of the silicon substrate 30. An insulating layer such as a silicon nitride layer having a thickness of 20 nm is formed over the silicon substrate 30 by using LPCVD. The silicon nitride layer on the second gate electrode layer 40 and the gate insulating layer 16 is removed by using anisotropic etching. As a result, a sidewall insulating layer 42 is selectively formed on a side surface of the two-step gate electrodes 40a, as shown in FIG. 2N.

Figure 2O:
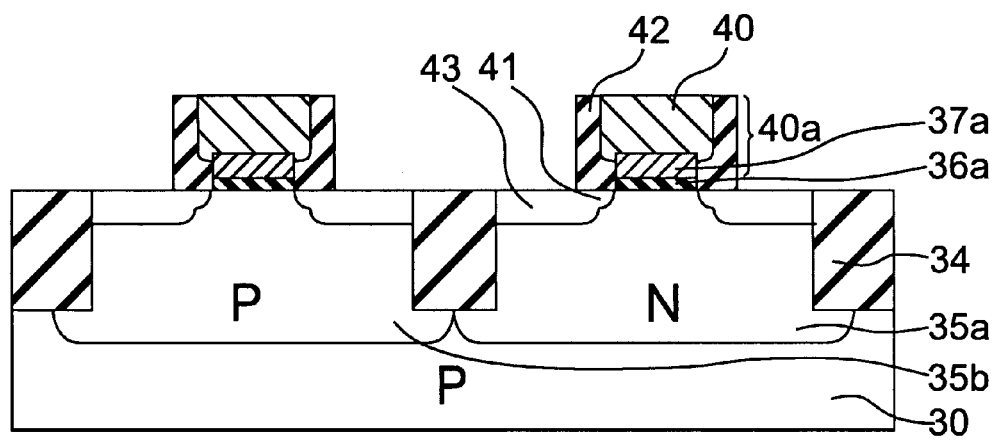
Figure 2P:
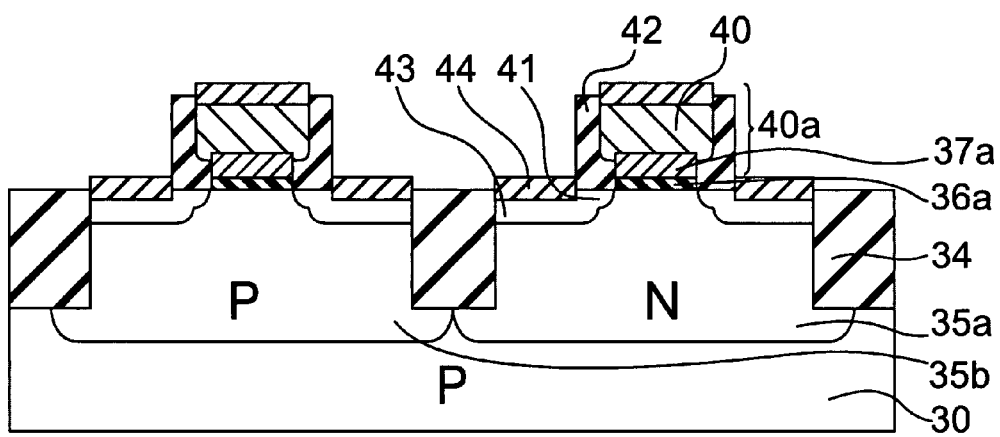

Boron ions as p-type impurities and phosphorus ions or arsenic ions as n-type impurities are implanted into the n-well region, and the p-well region, respectively, with a dose of approximately 1 E 15 cm$^{-2}$ to 1 E 16 cm$^{-2}$ by using lithography and ion implantation, employing the second gate electrode layer 40 and sidewall insulating layer 42 as a mask. The source-drain regions 43 with a comparatively deep junction depth are formed as shown in FIG. 2O. Subsequent rapid thermal annealing at a temperature of 900° C. and for a time of 10 second activates the implanted impurities. Moreover, spike thermal annealing for a time below 1 millisecond may be employed to fully prevent the implanted impurities from diffusing laterally and deeply in the silicon substrate 30.

A nickel layer is formed over the silicon substrate 30. By subsequent thermal annealing at a temperature of 700° C. and for a time of 30 seconds, a nickel-silicon compound electrode layer 44, as a salicide structure, is formed on the source-drain regions 43.

As the nickel layer on the second electrode layer 20 reacts with an excess silicon in the second electrode layer 40, the nickel-silicon compound layer 44 is also formed on the second electrode layer 40. Subsequently, the residual nickel layer is selectively removed by wet etching.

A silicon oxide layer (not illustrated) is formed over the silicon substrate 30 by using plasma-assisted CVD. Contact holes are opened in the silicon oxide layer. A metal interconnection is formed. Furthermore, the formation of the silicon oxide layer, the contact holes, and the metal interconnection are carried out, as required. A multilevel interconnection can be formed. The surface of the silicon substrate 30 is covered with a protective insulating layer. Pad portions may be opened to complete the semiconductor device according to the second embodiment.

According to the second embodiment, the extension regions are formed by using the second gate electrode layer as a mask to separate the predetermined length from the channel region. As a result, a short channel effect on the MISFET can be suppressed.

Moreover, the two-step gate electrode is an effective structure. The silicon-germanium compound layer as the first gate electrode layer has a comparatively high activation ratio of the impurities which leads to the suppression of extending the depletion region in the silicon-germanium compound layer. A silicon-metal compound as the second gate electrode layer leads to the low resistance of the gate interconnection.

Furthermore, the first gate length L1 of the first gate electrode layer is defined by lithography and the first gate electrode layer has comparatively thinner film thickness of 40 nm, thus the uniformity degree of the gate electrode patterns is high.

In addition, the first gate length L1 is miniaturized down to such as 80 nm; therefore, the two-step gate electrode may bring a great improvement to a miniaturized MISFET than a conventional MISFET on the device performances. The first gate electrode layer may be partially overlapped on the extension regions from the view point of controlling the MISFET characteristics.

Furthermore, utilizing a thermal silicon oxide film as the gate insulating layer may provide comparatively stable device characteristics. Forming silicon-metal compound on the source-drain region can provide a high speed MISFET.

Other embodiments of the present invention will be apparent to those skilled in the art from consideration of the specification and practice of the invention disclosed herein. It is intended that the specification and example embodiments be considered as exemplary only, with a true scope and spirit of the invention being indicated by the claims that follow. The invention can be carried out by being variously modified within a range not deviated from the gist of the invention.

For example, a SOI substrate and compound semiconductor substrates such as a GaAs substrate as well as a silicon substrate can be used as the semiconductor substrate.

Moreover, the gate insulating layer may be a silicon nitride layer, a silicon oxy-nitride layer which contains both oxygen and nitrogen by various composition, a metal oxide layer, such as a zirconium oxide layer, a titanium oxide layer, an aluminum oxide layer, a compound layer of those oxide layers and a stacked layer of those oxide layers as well as a hafnium oxide layer and a silicon oxide layer. Furthermore, the first gate electrode and the second gate electrode may be an amorphous silicon or an amorphous germanium-silicon compound as well as a polycrystalline silicon or a polycrystalline germanium-silicon compound. On the other hand, a material of the first gate electrode and the second gate electrode may be metal such as Co, Ti, Ni , W, Ta, and Mo, or metal-silicon compound such as Co-silicon compound, Ti-silicon compound, Ni-silicon compound, W-silicon compound, Ta-silicon compound and Mo-silicon compound as well as silicon or germanium-silicon compound. In addition, metal-silicon compound as a low resistance material may be Ni-silicon compound, Ti-silicon compound, W-silicon compound, Ta-silicon compound and Mo-silicon compound as well as Co-silicon compound.

What is claimed is:

1. A method of fabricating a semiconductor device, comprising:

forming a gate insulating layer on a semiconductor substrate;

forming a first gate electrode layer on the gate insulating layer;

forming a dummy gate electrode layer on the first gate electrode layer;

selectively removing the dummy gate electrode layer and the first gate electrode layer to form proto-gate electrodes each having the dummy gate electrode layer stacked on the first gate electrode layer;

forming an embedded layer between the proto-gate electrodes;

removing the dummy gate electrode layer of the proto-gate electrodes to form a space region on the first gate electrode layer;

extending the space region to a prescribed width by removing the portion of the embedded layer surrounding the space region;

forming a second gate electrode layer in the extended space region to form two-step gate electrodes having the second gate electrode layer stacked on the first gate electrode layer, wherein the gate length of the second gate electrode layer is longer than the gate length of the first gate electrode layer;

removing the embedded layer;

forming extension regions in the semiconductor substrate by introducing impurities employing the two-step gate electrodes as a mask;

forming a side-wall insulating layer on the side wall of the two-step gate electrodes; and forming source-drain regions in the semiconductor substrate by introducing impurities employing the two-step gate electrodes and the side-wall insulating layer as a mask.

2. The method of fabricating the semiconductor device according to claim 1, wherein forming the embedded layer between the proto-gate electrodes includes forming an insulating layer over the semiconductor substrate, and subsequently removing the insulating layer to flatten the surface of insulating layer and expose the surface of the proto-gate electrodes.

3. The method of fabricating the semiconductor device according to claim 1, wherein forming the second gate electrode layer in the extended space region includes forming the second gate electrode layer over the semiconductor substrate, and subsequently removing the second gate electrode layer to flatten the surface of the second gate electrode layer and expose the surface of the embedded layer.

4. The method of fabricating the semiconductor device according to claim 1, further comprising:
selectively removing the gate insulating layer using the first gate electrode layer as a mask between forming the proto-gate electrodes and forming the embedded layer.

5. The method of fabricating the semiconductor device according to claim 1, wherein a material of the second gate electrode layer is different from a material of the first gate electrode layer.

6. The method of fabricating the semiconductor device according to claim 5, wherein the material of the first gate electrode layer is silicon or silicon-germanium compound and the material of the second gate electrode layer is silicon-metal compound or metal.

7. The method of fabricating the semiconductor device according to claim 1, wherein the gate length of the first gate electrode layer is 100 nm or less.

8. The method of fabricating the semiconductor device according to claim 1, wherein the film thickness of the first gate electrode layer is 50 nm or less.

9. The method of fabricating the semiconductor device according to claim 1, wherein relative dielectric constant of the gate insulating layer is 8 or more.

10. The method of fabricating the semiconductor device according to claim 1, further comprising:
forming silicon-metal compound layers on the source-drain regions.

11. The method of fabricating the semiconductor device according to claim 1, wherein both forming the extension regions and forming the source-drain regions include implanting impurities and subsequently activating the impurities by rapid thermal annealing.

12. The method of fabricating the semiconductor device according to claim 11, wherein the rapid thermal annealing is performed at one millisecond or below.

13. The method of fabricating the semiconductor device according to claim 1, wherein removing the portion of the embedded layer surrounding the space region is performed by wet etching.

* * * * *